United States Patent
Inoue et al.

(10) Patent No.: US 8,576,025 B2
(45) Date of Patent: Nov. 5, 2013

(54) ACOUSTIC WAVE DEVICE, AND FILTER AND DUPLEXER USING THE SAME

(75) Inventors: Takashi Inoue, Osaka (JP); Hidekazu Nakanishi, Osaka (JP); Hiroyuki Nakamura, Osaka (JP); Shun-ichi Seki, Hyogo (JP); Shoji Okamoto, Osaka (JP)

(73) Assignee: Panasonic Corporation, Osaka (JP)

(*) Notice: Subject to any disclaimer, the term of this patent is extended or adjusted under 35 U.S.C. 154(b) by 434 days.

(21) Appl. No.: 12/976,030

(22) Filed: Dec. 22, 2010

(65) Prior Publication Data

US 2011/0156837 A1 Jun. 30, 2011

(30) Foreign Application Priority Data

Dec. 24, 2009 (JP) ................... 2009-291716

(51) Int. Cl.
*H03H 9/72* (2006.01)
*H03H 9/64* (2006.01)
*H03H 9/25* (2006.01)

(52) U.S. Cl.
USPC ......... 333/133; 333/193; 333/195; 310/313 B (58) Field of Classification Search
USPC ....... 333/133, 193–196, 153, 155; 310/313 B
See application file for complete search history.

(56) References Cited

U.S. PATENT DOCUMENTS

| 7,310,027 | B2* | 12/2007 | Kando | 333/133 |
| 7,456,544 | B2* | 11/2008 | Kando | 310/313 R |
| 7,486,001 | B2* | 2/2009 | Kando | 310/313 R |
| 7,581,306 | B2* | 9/2009 | Kadota et al. | 29/594 |
| 7,583,161 | B2* | 9/2009 | Tanaka | 333/133 |
| 7,619,491 | B2* | 11/2009 | Takata et al. | 333/133 |
| 7,659,653 | B2* | 2/2010 | Matsuda et al. | 310/313 B |
| 7,982,364 | B2* | 7/2011 | Takayama et al. | 310/313 R |
| 2008/0122557 | A1* | 5/2008 | Kando et al. | 333/193 |
| 2009/0115287 | A1* | 5/2009 | Kando | 310/313 A |
| 2009/0121810 | A1* | 5/2009 | Fujii et al. | 333/195 |
| 2011/0140808 | A1* | 6/2011 | Kurahashi et al. | 333/193 |

FOREIGN PATENT DOCUMENTS

| JP | 2007-028195 A | 2/2007 |
| WO | WO 2010/029657 | * 3/2010 |

* cited by examiner

*Primary Examiner* — Barbara Summons
(74) *Attorney, Agent, or Firm* — RatnerPrestia (57) ABSTRACT

An acoustic wave device includes a piezoelectric substrate, an IDT electrode provided on the piezoelectric substrate, a dielectric layer provided so as to cover the IDT electrode, and a first stress relaxation layer provided on the dielectric layer. Furthermore, the acoustic wave device includes an extraction electrode connected to the IDT electrode and extracted onto the first stress relaxation layer, and a bump provided on the extraction electrode. An elastic modulus of the first stress relaxation layer is smaller than that of the dielectric layer.

9 Claims, 7 Drawing Sheets

PRIOR ART

ACOUSTIC WAVE DEVICE, AND FILTER AND DUPLEXER USING THE SAME

BACKGROUND OF THE INVENTION

1. Field of the Invention

The present invention relates to an acoustic wave device used in, for example, portable terminals, and to a filter and a duplexer using the same.

2. Background Art

Figure 14:
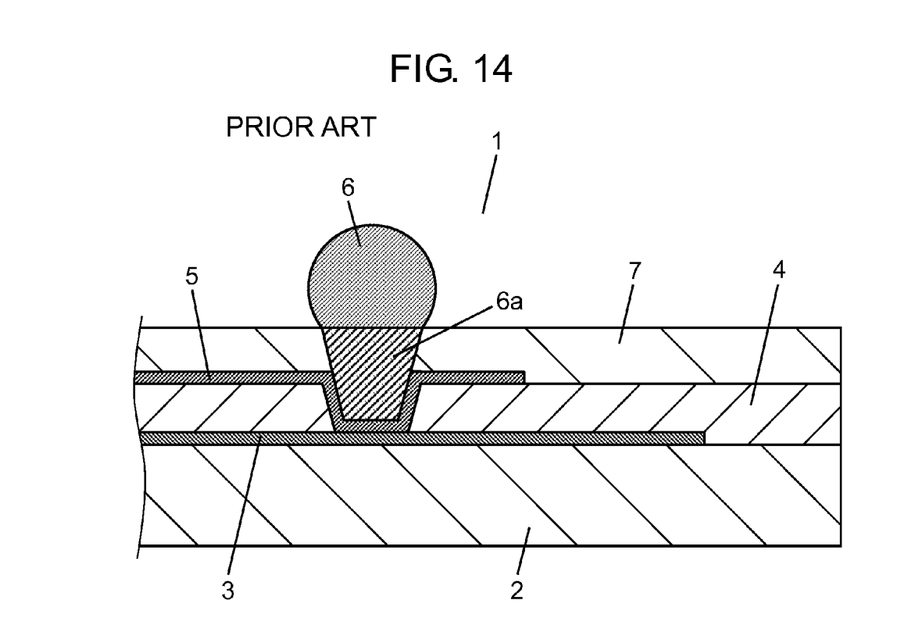
FIG. 14 is a partial sectional view showing a conventional acoustic wave device.

FIG. 14 is a partial sectional view showing a conventional acoustic wave device. Conventional acoustic wave device 1 includes piezoelectric substrate 2, IDT (Inter Digital Transducer) electrode 3 provided on piezoelectric substrate 2, and dielectric layer 4 provided on piezoelectric substrate 2 so as to cover IDT electrode 3. Furthermore, conventional acoustic wave device 1 includes extraction electrode 5 connected to IDT electrode 3 and extracted onto dielectric layer 4, bump 6 provided on extraction electrode 5 via metal layer 6a, and protective layer 7 provided on dielectric layer 4 so as to cover extraction electrode 5.

A thermal shock may be applied in a state in which acoustic wave device 1 is mounted on a mount board (not shown) by bump 6. At that time, a thermal stress due to a difference between the thermal expansion coefficient of acoustic wave device 1 and the thermal expansion coefficient of the mount board is transmitted to piezoelectric substrate 2 via bump 6 and metal layer 6a and through extraction electrode 5 and dielectric layer 4. As a result, a stress is applied to piezoelectric substrate 2, thus causing cracks in piezoelectric substrate 2.

In particular, when extraction electrode 5 is routed on the upper surface of dielectric layer 4 to form an inductance, since a contact area between extraction electrode 5 and dielectric layer 4 is increased, cracks may easily occur in piezoelectric substrate 2.

SUMMARY OF THE INVENTION

An acoustic wave device of the present invention includes a piezoelectric substrate, an IDT electrode provided on the piezoelectric substrate, a dielectric layer provided so as to cover the IDT electrode, and a first stress relaxation layer provided on the dielectric layer. Furthermore, the acoustic wave device includes an extraction electrode connected to the IDT electrode and extracted onto the dielectric layer. An elastic modulus of the first stress relaxation layer is smaller than that of the dielectric layer.

DETAILED DESCRIPTION OF THE INVENTION

Figure 1:
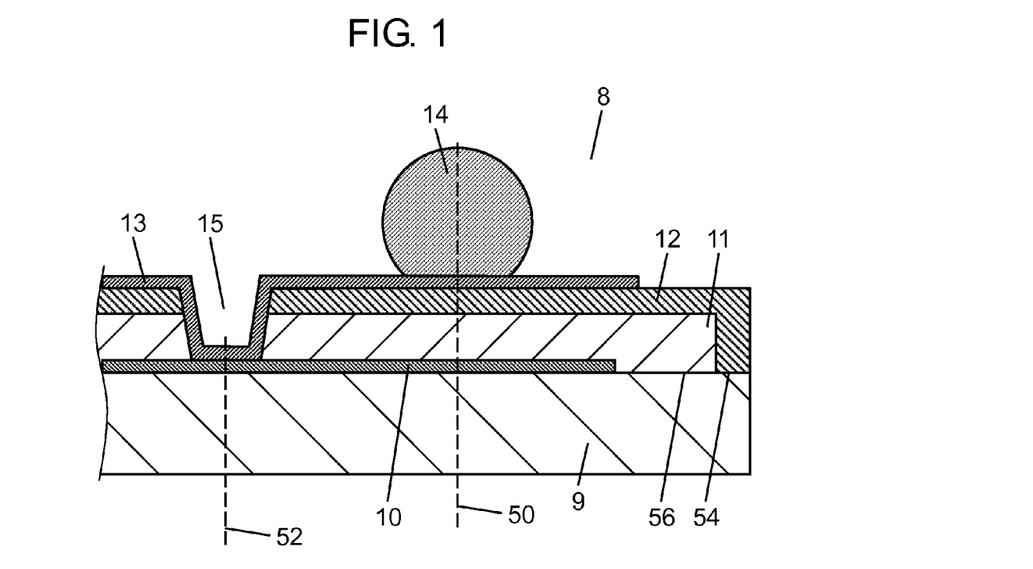
FIG. 1 is a partial sectional view showing an acoustic wave device in accordance with an embodiment of the present invention.

FIG. 1 is a partial sectional view showing acoustic wave device 8 in accordance with an embodiment of the present invention. Acoustic wave device 8 includes piezoelectric substrate 9, IDT electrode 10 provided on piezoelectric substrate 9, dielectric layer 11 provided so as to cover IDT electrode 10, and first stress relaxation layer 12 provided on dielectric layer 11. Furthermore, acoustic wave device 8 includes extraction electrode 13 connected to IDT electrode 10 and extracted onto first stress relaxation layer 12, and bump 14 provided on extraction electrode 13.

Piezoelectric substrate 9 is formed of a single crystal piezoelectric substance having a plate thickness of about 100 μm or more and 350 μm or less. Piezoelectric substrate 9 is a single crystal plate of, for example, quartz, lithium tantalate, lithium niobate, or potassium niobate.

The film thickness of IDT electrode 10 is about 0.1 μm or more and 0.5 μm or less. IDT electrode 10 is a single metal such as aluminum, copper, silver, gold, titanium, tungsten, platinum, chromium, nickel, and molybdenum. Alternatively, IDT electrode 10 has a configuration of an alloy including the above-mentioned metals as a main component or a configuration in which the above-mentioned metals are laminated. IDT electrode 10 is formed on piezoelectric substrate 9 by, for example, sputtering or vapor deposition.

Dielectric layer 11 desirably uses a medium such as silicon dioxide ($SiO_2$) having a frequency-temperature characteristic reverse to those of piezoelectric substrate 9. With this configuration, the frequency-temperature characteristic of acoustic wave device 8 is improved. Dielectric layer 11 is formed on piezoelectric substrate 9 and IDT electrode 10 by, for example, sputtering or vapor deposition or CVD.

First stress relaxation layer 12 is formed of a material having an elastic modulus smaller than that of dielectric layer 11. For example, for first stress relaxation layer 12, resin mainly composed of any of polyimide, phenol, epoxy, acrylic, and polybenzoxazole (PBO) can be used. In particular, when polyimide and PBO resin are used, the heat resistance of first stress relaxation layer 12 can be improved. Furthermore, when the film thickness of first stress relaxation layer 12 is 1 μm or more, a sufficient stress relaxation effect can be obtained. First stress relaxation layer 12 is formed on dielectric layer 11 by, for example, spin coating and printing.

Extraction electrode 13 is made of a single metal such as aluminum, copper, silver, gold, titanium, nickel, platinum, and chromium, or an alloy mainly composed of these metals or a laminate of these metals. It is desirable that when extraction electrode 13 is formed of copper having an excellent conductivity as a main component, loss due to wiring resistance can be reduced.

Extraction electrode 13 is also formed along the side surface and the bottom surface of through hole 15 provided in dielectric layer 11 and first stress relaxation layer 12. With this configuration, extraction electrode 13 is electrically connected to IDT electrode 10 at the bottom of through hole 15, and extracted onto the upper surface of first stress relaxation layer 12 along the side surface of through hole 15. Extraction electrode 13 is formed on the bottom and side surfaces of through hole 15 and the upper surface of first stress relaxation layer 12 by, for example, sputtering or vapor deposition or plating.

Bump 14 is, for example, Sb—Ag-based non-lead solder, and is formed by printing or plating or soldering ball mounting.

As mentioned above, in acoustic wave device 8, first stress relaxation layer 12 is provided between extraction electrode 13 and dielectric layer 11. Since an elastic modulus of first stress relaxation layer 12 is smaller than that of dielectric layer 11, a thermal stress transmitted from bump 14 via extraction electrode 13 is relaxed. Therefore, distortion given to piezoelectric substrate 9 is reduced. Thus, occurrence of cracks can be suppressed.

It is desirable that the elastic modulus of first stress relaxation layer 12 is 10 GPa or less. When the elastic modulus is 10 GPa or less, a thermal stress transmitted from bump 14 via extraction electrode 13 can be relaxed effectively.

Furthermore, it is preferable that center position 50 of bump 14 and center position 52 of through hole 15 are made to be different from each other. Thus, a thermal stress transmitted from bump 14 to IDT electrode 10 or reinforcing part 16 (see FIG. 3) via extraction electrode 13 can be relaxed. It is desirable that when center position 50 of bump 14 is located at the outer side (the end portion side of piezoelectric substrate 9) from center position 52 of through hole 15, bump 14 can be provided at the outer end portion of acoustic wave device 8, and a distance between a plurality of bumps 14 can be maintained.

Furthermore, it is preferable that outer end portion 54 of first stress relaxation layer 12 is formed at the outer side of outer end portion 56 of dielectric layer 11 and that first stress relaxation layer 12 is brought into contact with piezoelectric substrate 9 at the outer side of dielectric layer 11. With this configuration, an effect of relaxing a thermal stress on dielectric layer 11 can be further enhanced.

Figure 2:
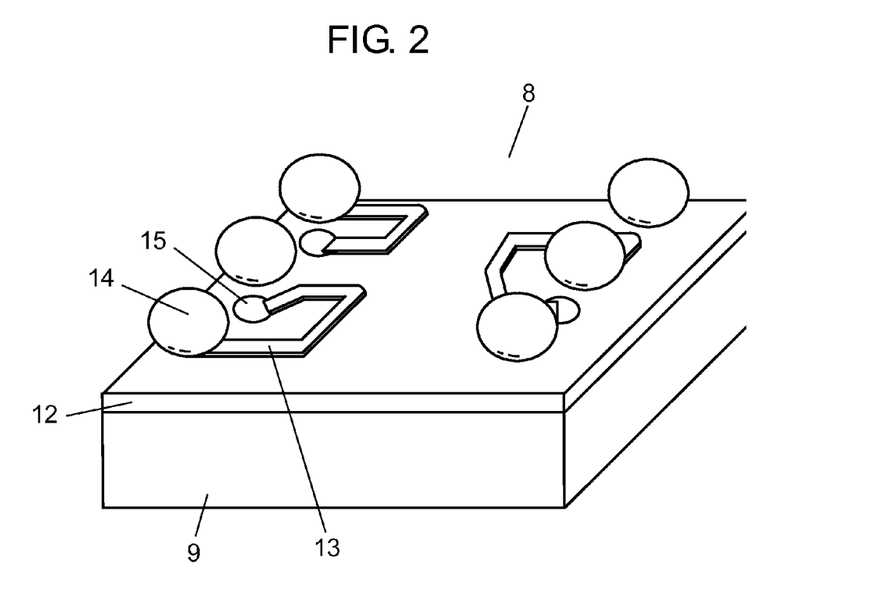
FIG. 2 is a perspective view showing an acoustic wave device in accordance with the embodiment of the present invention.

FIG. 2 is a perspective view showing acoustic wave device 8 in accordance with this embodiment. An inductance is formed by routing extraction electrode 13 between through hole 15 and bump 14. As shown in FIG. 14, in conventional acoustic wave device 1, since a contact area between extraction electrode 5 and dielectric layer 4 becomes large, cracks may easily occur in piezoelectric substrate 2. However, in acoustic wave device 8 of this embodiment, as shown in FIG. 2, by providing first stress relaxation layer 12, a contact area between extraction electrode 13 and dielectric layer 11 is reduced. Thus, an inductance can be formed by extraction electrode 13. Even when the inductance is formed, occurrence of cracks in piezoelectric substrate 9 can be suppressed.

Figure 3:
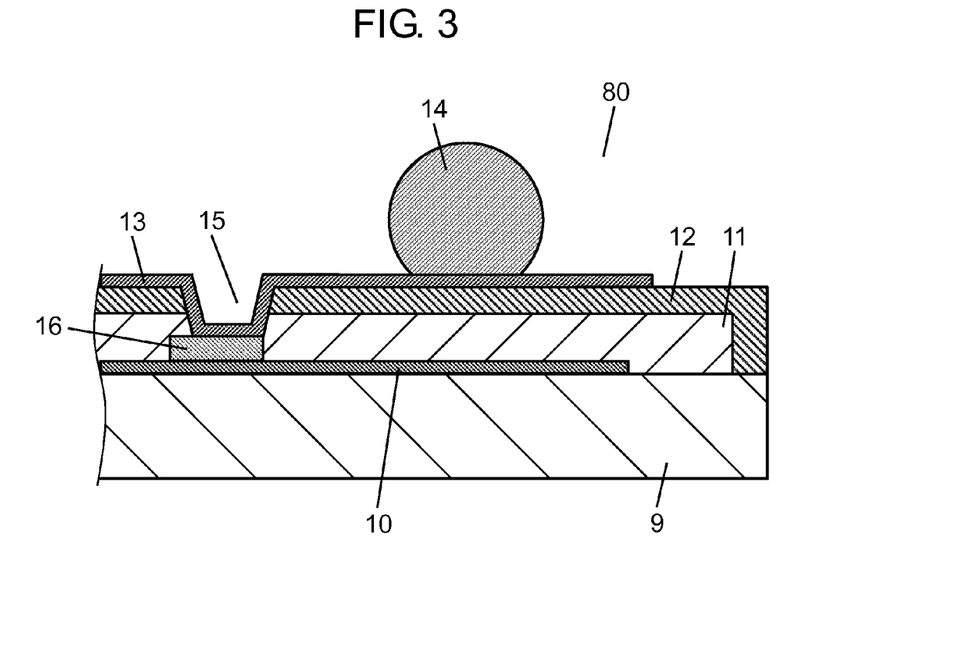
FIG. 3 is a partial sectional view showing another acoustic wave device in accordance with the embodiment of the present invention.

FIG. 3 is a partial sectional view showing acoustic wave device 80 in accordance with the embodiment of the present invention. In this configuration, in addition to the configuration of FIG. 1, reinforcing part 16 is provided in a portion in which IDT electrode 10 and extraction electrode 13 are connected. With reinforcing part 16, IDT electrode 10 and extraction electrode 13 can be electrically connected to each other reliably. Reinforcing part 16 may be made of a different material from that of IDT electrode 10 but it may be preferably made of the same material.

Figure 4:
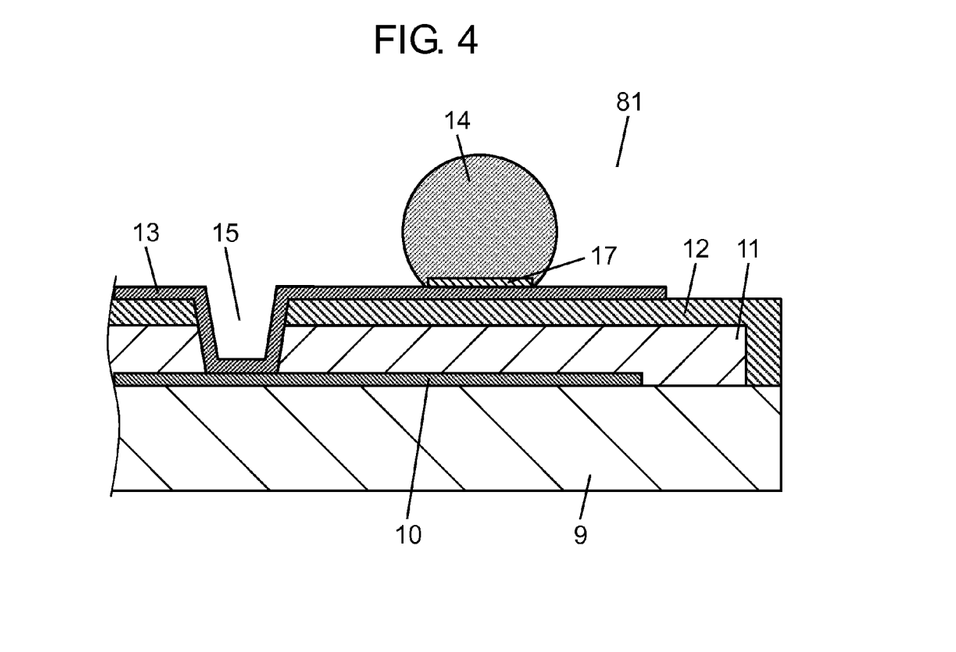
FIG. 4 is a partial sectional view showing still another acoustic wave device in accordance with the embodiment of the present invention.

FIG. 4 is a partial sectional view showing acoustic wave device 81 in accordance with the embodiment of the present invention. In this configuration, in addition to the configuration of FIG. 1, metal layer 17 is provided between extraction electrode 13 and bump 14. Thus, regardless of materials of extraction electrode 13, connection reliability between extraction electrode 13 and bump 14 can be improved. Metal layer 17 is made of a single metal such as nickel, copper, gold, and chromium, or an alloy including these metals as a main component or a laminate of these metals. Furthermore, metal layer 17 may be formed of the same material as that of extraction electrode 13, and made to be partially thick only in a part in which extraction electrode 13 is formed. With this configuration, adhesion between metal layer 17 and extraction electrode 13 is enhanced.

Figure 5:
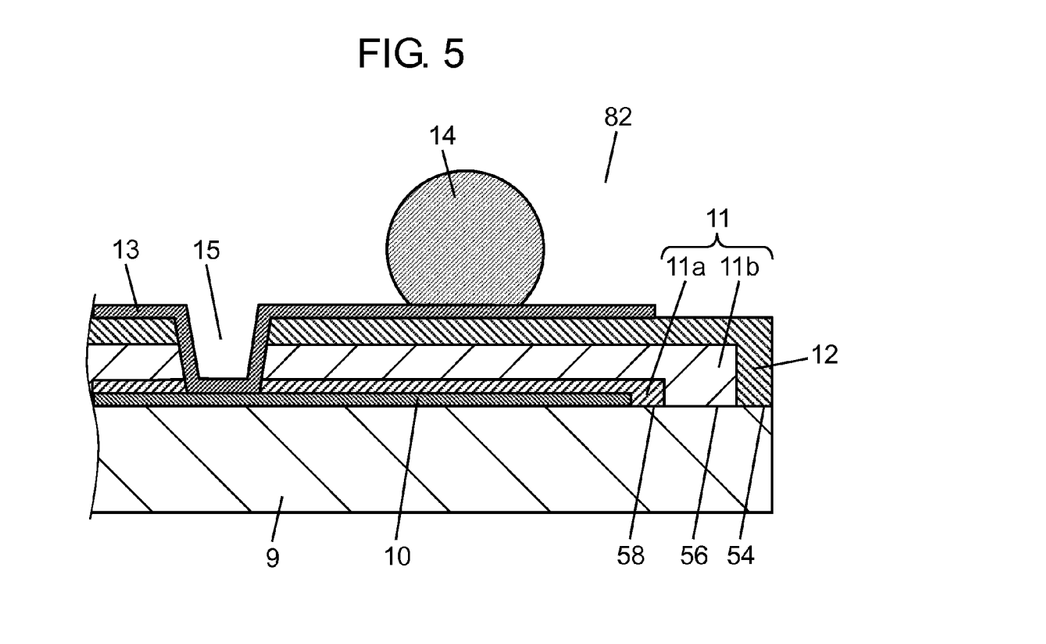
FIG. 5 is a partial sectional view showing yet another acoustic wave device in accordance with the embodiment of the present invention.

FIG. 5 is a partial sectional view showing acoustic wave device 82 in accordance with the embodiment of the present invention. In this configuration, in addition to the configuration of FIG. 1, dielectric layer 11 is formed by laminating dielectric layer 11a and dielectric layer 11b which are made of different materials.

Acoustic wave device 82 is desired to have small propagation attenuation. In order to reduce the propagation attenuation, it is necessary to strengthen the confinement of the acoustic wave. By forming dielectric layer 11 consisting of dielectric layer 11a and dielectric layer 11b, which are made of different materials, an SH wave as a principal wave can be effectively confined in acoustic wave device 82. Herein, it is preferable that dielectric layer 11b is formed of a medium in which a transverse wave propagates faster than the speed of a transverse wave propagating through piezoelectric substrate 9.

When the film thickness of dielectric layer 11b is 0.8 times or more of wavelength λ of an SH wave as a principal wave, a remarkable confinement effect can be exhibited. The film thickness of dielectric layer 11b is desirably made to be wavelength λ or more of an SH wave as a principal wave, the principle waves can be confined in acoustic wave device 82 almost completely.

For example, dielectric layer 11a includes $SiO_2$, and dielectric layer 11b includes silicon nitride (SiN), silicon oxynitride (SiON), aluminum nitride (AlN), aluminum oxide ($Al_2O_3$), silicon (Si), and the like, which are media in which a transverse wave propagates fast. When dielectric layer 11b desirably includes silicon nitride (SiN) and silicon oxynitride (SiON), moisture from the outside can be blocked to prevent corrosion of IDT electrode 10. Dielectric layer 11b is formed on piezoelectric substrate 9 so as to cover IDT electrode 10 by, for example, sputtering or vapor deposition or CVD.

Furthermore, as shown in FIG. 5, it is preferable that outer end portion 56 of dielectric layer 11b is formed at the outer side from outer end portion 58 of dielectric layer 11a, and that dielectric layer 11b is brought into contact with piezoelectric substrate 9 at the outer side of dielectric layer 11a. This configuration can suppress the intrusion of moisture from an interface between piezoelectric substrate 9 and dielectric layer 11a and can suppress corrosion of IDT electrode 10.

Figure 6:
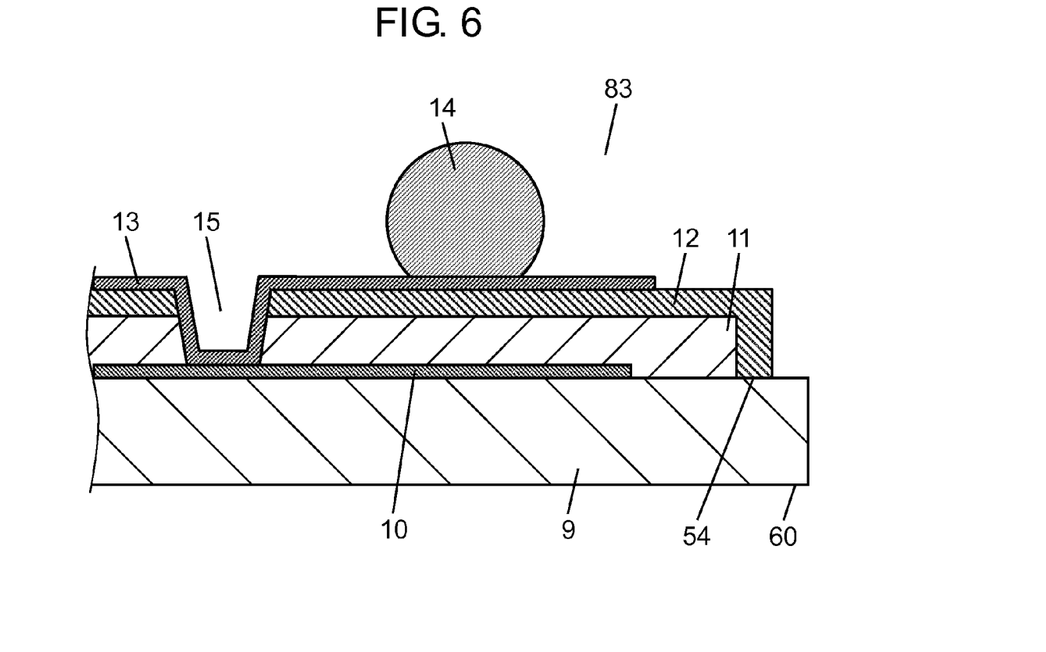
FIG. 6 is a partial sectional view showing a further acoustic wave device in accordance with the embodiment of the present invention.

FIG. 6 is a partial sectional view showing acoustic wave device 83 in accordance with the embodiment of the present invention. In this configuration, in addition to the configuration of FIG. 1, outer end portion 60 of piezoelectric substrate 9 is located at the outer side from outer end portion 54 of first stress relaxation layer 12. This can suppress occurrence of cracks in piezoelectric substrate 9 when acoustic wave device 83 is subjected to dicing.

Figure 7:
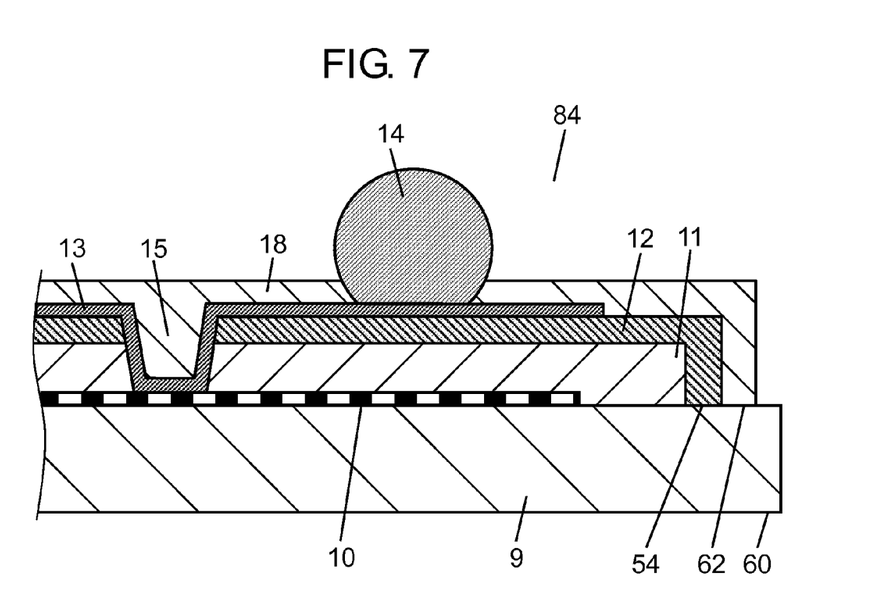
FIG. 7 is a partial sectional view showing a still further acoustic wave device in accordance with the embodiment of the present invention.

FIG. 7 is a partial sectional view showing acoustic wave device 84 in accordance with the embodiment. In this configuration, in addition to the configuration of FIG. 1, except a portion to which bump 14 is brought into contact with extraction electrode 13, second stress relaxation layer 18 is formed so as to cover extraction electrode 13. Second stress relaxation layer 18 protects extraction electrode 13 from moisture or mechanical shock from the outside. Furthermore, when the elastic modulus of second stress relaxation layer 18 is made to be smaller than that of dielectric layer 11, a thermal stress transmitted from bump 14 via extraction electrode 13 can be reduced, and distortion given to piezoelectric substrate 9 can be reduced.

Since second stress relaxation layer 18 is brought into contact with the upper surface of extraction electrode 13 and also with bump 14, a thermal stress from bump 14 is transmitted more easily as compared with first stress relaxation layer 12. Therefore, by making the elastic modulus of second stress relaxation layer 18 be equal to or smaller than the elastic modulus of first stress relaxation layer 12, the thermal stress from bump 14 can be reduced. As a result, distortion given to piezoelectric substrate 9 can be further reduced. When second stress relaxation layer 18 and first stress relaxation layer 12 are formed of the same materials, the adhesion between second stress relaxation layer 18 and first stress relaxation layer 12 can be improved.

Furthermore, when outer end portion 62 of second stress relaxation layer 18 is formed at the outer side from outer end portion 54 of first stress relaxation layer 12, so that second stress relaxation layer 18 is brought into contact with piezoelectric substrate 9 at the outer side of first stress relaxation layer 12, intrusion of moisture from the interface between piezoelectric substrate 9 and dielectric layer 11 can be suppressed, and corrosion of IDT electrode 10 can be suppressed.

Furthermore, by locating outer end portion 60 of piezoelectric substrate 9 at the outer side from outer end portion 62 of second stress relaxation layer 18, it is possible to suppress occurrence of cracks in piezoelectric substrate 9 when acoustic wave device 84 is subjected to dicing.

In this embodiment, extraction electrode 13 is formed on the upper surface of first stress relaxation layer 12, and second stress relaxation layer 18 is formed so as to cover extraction electrode 13. However, the present invention is not limited to this configuration. For example, extraction electrode 13 may be provided on the upper surface of the second stress relaxation layer. In addition, a third stress relaxation layer (not shown) covering extraction electrode 13 may be formed. With this configuration, a thermal stress transmitted from bump 14 via the extraction electrode can be efficiently relaxed by the stress relaxation layer, distortion given to piezoelectric substrate 9 can be reduced, and occurrence of cracks can be suppressed.

Figure 8:
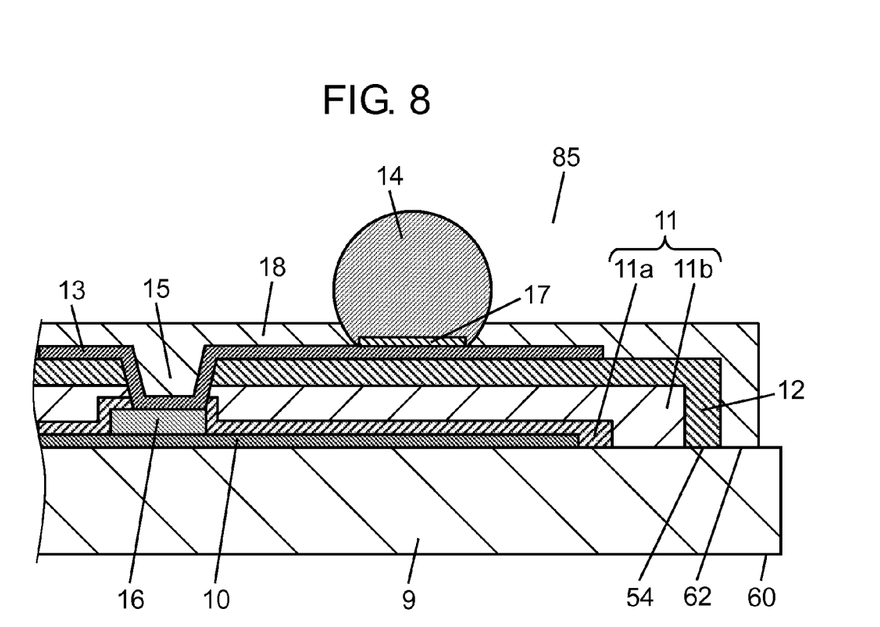
FIG. 8 is a partial sectional view showing a yet further acoustic wave device in accordance with the embodiment of the present invention.

FIG. 8 is a partial sectional view showing acoustic wave device 85 in accordance with the embodiment of the present invention. Acoustic wave device 85 includes piezoelectric substrate 9, IDT electrode 10 provided on piezoelectric substrate 9, dielectric layer 11 provided so as to cover IDT electrode 10, and first stress relaxation layer 12 provided on dielectric layer 11. Furthermore, acoustic wave device 85 includes extraction electrode 13 connected to IDT electrode 10 and extracted onto first stress relaxation layer 12, and bump 14 provided on extraction electrode 13. Furthermore, acoustic wave device 85 includes second stress relaxation layer 18, reinforcing part 16, and metal layer 17. Dielectric layer 11 includes dielectric layer 11a and dielectric layer 11b. With such a configuration, occurrence of cracks can be suppressed and the reliability of acoustic wave device 85 can be improved.

Figure 9:
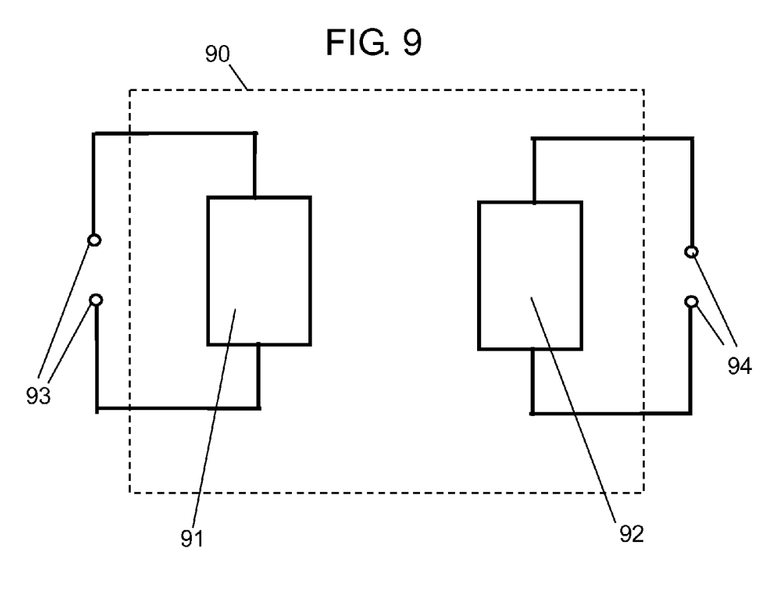
FIG. 9 is a block diagram showing a filter in accordance with the embodiment of the present invention.

FIG. 9 is a block diagram showing filter 90 in accordance with the embodiment of the present invention. Filter 90 is configured by using acoustic wave device 8, 80, 81, 82, 83, 84 or 85 of this embodiment as input acoustic wave device 91 and output acoustic wave device 92. Piezoelectric substrate 9, dielectric layer 11 and first stress relaxation layer 12 are used in common.

Figure 10:
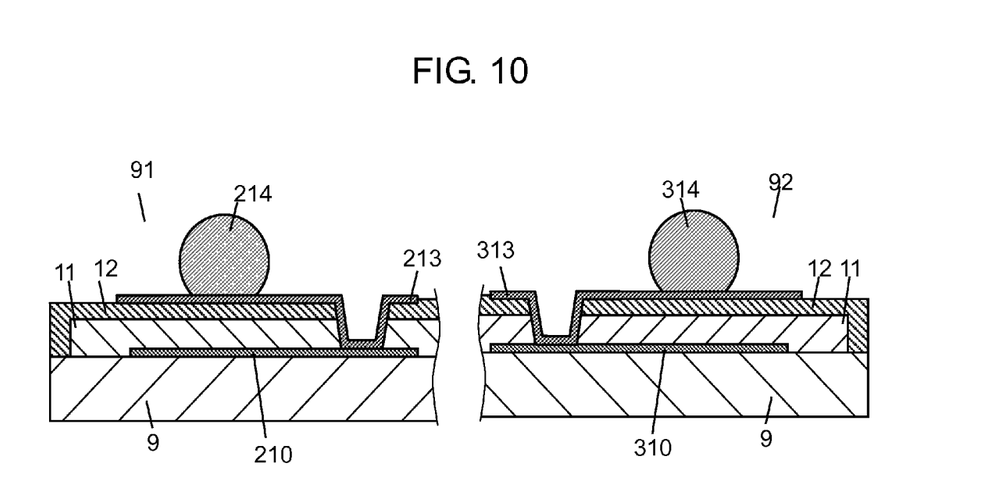
FIG. 10 is a partial sectional view showing a filter in accordance with the embodiment of the present invention.

FIG. 10 is a partial sectional view showing filter 90 in accordance with the embodiment of the present invention. That is to say, filter 90 includes piezoelectric substrate 9, first IDT electrode 210 and second IDT electrode 310 provided on piezoelectric substrate 9, and dielectric layer 11 provided so as to cover first IDT electrode 210 and second IDT electrode 310. Furthermore, filter 90 includes first stress relaxation layer 12 provided on dielectric layer 11 and having a smaller elastic modulus than that of dielectric layer 11. Furthermore, filter 90 includes first extraction electrode 213 connected to first IDT electrode 210 and extracted onto first stress relaxation layer 12, and second extraction electrode 313 connected to second IDT electrode 310 and extracted onto first stress relaxation layer 12. Furthermore, filter 90 includes first bump 214 provided on first extraction electrode 213 and second bump 314 provided on second extraction electrode 313.

Input acoustic wave device 91 includes piezoelectric substrate 9, first IDT electrode 210, dielectric layer 11, first stress relaxation layer 12, first extraction electrode 213, and first bump 214. Output acoustic wave device 92 includes piezoelectric substrate 9, second IDT electrode 310, dielectric layer 11, first stress relaxation layer 12, second extraction electrode 313, and second bump 314.

When an electric signal is input from input terminal 93 to input acoustic wave device 91, a surface acoustic wave is generated. The surface acoustic wave propagates along the surface of piezoelectric substrate 9, reaches output acoustic wave device 92, is converted into an electric signal, and is output from output terminal 94. Filter 90 is configured as mentioned above, it is possible to obtain a filter in which cracks in piezoelectric substrate 9 is suppressed and which has high reliability.

Figure 11:
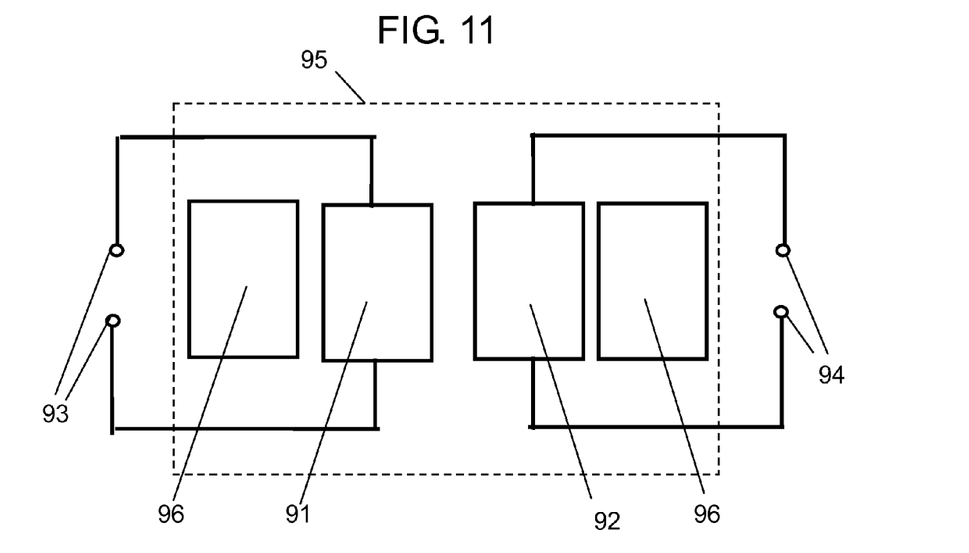
FIG. 11 is a block diagram showing another filter in accordance with the embodiment of the present invention.

FIG. 11 is a block diagram showing another filter 95 in accordance with the embodiment of the present invention. Acoustic wave device 8, 80, 81, 82, 83, 84, or 85 of this embodiment is used as input acoustic wave device 91 and output acoustic wave device 92. Piezoelectric substrate 9, dielectric layer 11, and first stress relaxation layer 12 are used in common. Furthermore, reflectors 96 are formed on both sides of input acoustic wave device 91 and output acoustic wave device 92. When filter 95 is configured as mentioned above, it is possible to obtain a filter in which cracks in piezoelectric substrate 9 is suppressed and which has high reliability.

Figure 12:
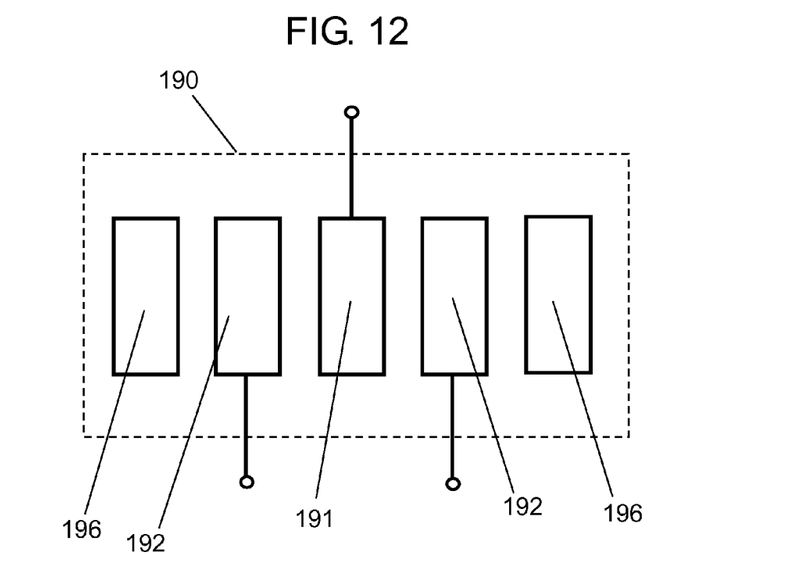
FIG. 12 is a block diagram showing still another filter in accordance with the embodiment of the present invention.

FIG. 12 is a block diagram showing another filter 190 in accordance with the embodiment of the present invention. Acoustic wave device 8, 80, 81, 82, 83, 84, or 85 of this embodiment is used as input acoustic wave device 191 and output acoustic wave device 192. Piezoelectric substrate 9, dielectric layer 11, and first stress relaxation layer 12 are used in common. That is to say, the first IDT electrode of input acoustic wave device 191 is used as an input electrode and the IDT electrode of output acoustic wave device 192 is used as an output electrode. Furthermore, reflectors 196 are formed on both sides of output acoustic wave device 192. When filter 190 is configured as mentioned above, it is possible to obtain a filter in which cracks in piezoelectric substrate 9 is suppressed and which has high reliability.

Figure 13:
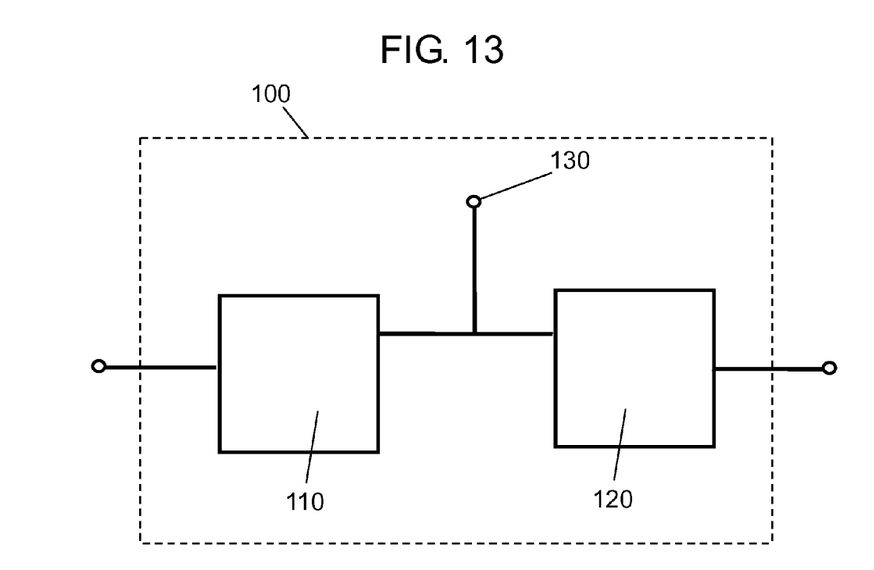
FIG. 13 is a block diagram showing a duplexer in accordance with the embodiment of the present invention.

FIG. 13 is a block diagram showing duplexer 100 in accordance with the embodiment of the present invention. Duplexer 100 uses filters 90 shown in FIG. 9 as receiving filter 110 and transmission filter 120.

Antenna 130 is connected to receiving filter 110 and transmission filter 120, respectively. That is to say, antenna 130 is shared by receiving filter 110 and transmission filter 120.

Received signals are received by antenna 130, and then pass through receiving filter 110. Only a necessary signal is taken out from the received signal, is converted into a voice, and transmitted to a user. Furthermore, a voice spoken by a user is converted into a transmitted signal. The transmitted signal passes through transmission filter 120 and only a necessary signal is transmitted from antenna 130.

When duplexer 100 uses acoustic wave device 8, 80, 81, 82, 83, 84, or 85 of this embodiment, a duplexer in which cracks are suppressed in piezoelectric substrate 9 and which has high reliability can be obtained. In duplexer 100, filter 95 shown in FIG. 11 or filter 190 shown in FIG. 12 may be used instead of filter 90.

As mentioned above, an acoustic wave device, and a filter and a duplexer using the acoustic wave device of the present invention are useful in portable terminals and the like since they suppress occurrence of cracks in a piezoelectric substrate and can improve the reliability of the acoustic wave device.

What is claimed is:

1. An acoustic wave device comprising:
a piezoelectric substrate;
an IDT electrode provided on the piezoelectric substrate;
a dielectric layer provided so as to cover the IDT electrode;
a first stress relaxation layer provided on the dielectric layer; and
an extraction electrode connected to the IDT electrode and extracted onto the first stress relaxation layer,
wherein an elastic modulus of the first stress relaxation layer is smaller than an elastic modulus of the dielectric layer, and
the first stress relaxation layer is brought into contact with the piezoelectric substrate at an outer side of the dielectric layer.

2. The acoustic wave device of claim 1,
where an outer end portion of the piezoelectric substrate is located at an outer side from an outer end portion of the first stress relaxation layer.

3. An acoustic wave device comprising:
a piezoelectric substrate;
an IDT electrode provided on the piezoelectric substrate;
a dielectric layer provided so as to cover the IDT electrode;
a first stress relaxation layer provided on the dielectric layer;
an extraction electrode connected to the IDT electrode and extracted onto the first stress relaxation layer;
a bump provided on the extraction electrode; and
a metal layer between the extraction electrode and the bump,
wherein an elastic modulus of the first stress relaxation layer is smaller than an elastic modulus of the dielectric layer.

4. An acoustic wave device comprising:
a piezoelectric substrate;
an IDT electrode provided on the piezoelectric substrate;
a dielectric layer provided so as to cover the IDT electrode;
a first stress relaxation layer provided on the dielectric layer;
an extraction electrode connected to the IDT electrode and extracted onto the first stress relaxation layer; and
a second stress relaxation layer provided so as to cover the extraction electrode,
wherein an elastic modulus of the first stress relaxation layer is smaller than an elastic modulus of the dielectric layer,
an elastic modulus of the second stress relaxation layer is smaller than an elastic modulus of the dielectric layer,
the first stress relaxation layer is brought into contact with the piezoelectric substrate at an outer side of the dielectric layer, and
the second stress relaxation layer is brought into contact with the piezoelectric substrate at an outer side of the first stress relaxation layer.

5. The acoustic wave device of claim 4,
wherein an outer end portion of the piezoelectric substrate is located at an outer side from an outer end portion of the second stress relaxation layer.

6. A filter comprising:
a piezoelectric substrate;
a first IDT electrode and a second IDT electrode provided on the piezoelectric substrate;
a dielectric layer provided so as to cover the first IDT electrode and the second IDT electrode;
a first stress relaxation layer provided on the dielectric layer and having an elastic modulus smaller than an elastic modulus of the dielectric layer;
a first extraction electrode connected to the first IDT electrode and extracted onto the first stress relaxation layer;
a second extraction electrode connected to the second IDT electrode and extracted onto the first stress relaxation layer;
a first bump provided on the first extraction electrode; and
a second bump provided on the second extraction electrode,
wherein the first stress relaxation layer is brought into contact with the piezoelectric substrate at an outer side of the dielectric layer,
an electric signal is input to the first IDT electrode, and the electric signal is output from the second IDT electrode.

7. The filter of claim 6,
wherein two of the second IDT electrodes are formed with respect to the first IDT electrode, and
the first IDT electrode is used as an input electrode and the two of the second IDT electrodes are used as an output electrode.

8. A duplexer comprising:
a receiving filter including:
a first piezoelectric substrate;
a first IDT electrode and a second IDT electrode provided on the first piezoelectric substrate;
a first dielectric layer provided so as to cover the first IDT electrode and the second IDT electrode;
a first stress relaxation layer provided on the first dielectric layer and having an elastic modulus smaller than an elastic modulus of the first dielectric layer,
a first extraction electrode connected to the first IDT electrode and extracted onto the first stress relaxation layer;
a second extraction electrode connected to the second IDT electrode and extracted onto the first stress relaxation layer;
a first bump provided on the first extraction electrode; and a second bump provided on the second extraction electrode,
wherein the first stress relaxation layer is brought into contact with the piezoelectric substrate at an outer side of the first dielectric layer,
a transmission filter including:
   a second piezoelectric substrate;
   a third IDT electrode and a fourth IDT electrode provided on the second piezoelectric substrate;
   a second dielectric layer provided so as to cover the third IDT electrode and the fourth IDT electrode;
   a second stress relaxation layer provided on the second dielectric layer and having an elastic modulus smaller than an elastic modulus of the second dielectric layer,
   a third extraction electrode connected to the third IDT electrode and extracted onto the second stress relaxation layer;
   a fourth extraction electrode connected to the fourth IDT electrode and extracted onto the second stress relaxation layer;
   a third bump provided on the third extraction electrode; and
   a fourth bump provided on the fourth extraction electrode,
wherein the second stress relaxation layer is brought into contact with the piezoelectric substrate at an outer side of the second dielectric layer, and
an antenna connected to the receiving filter and the transmission filter, respectively,
wherein a transmitted signal passes through the transmission filter and is transmitted from the antenna, and a received signal is received by the antenna and then passes through the receiving filter.

9. The duplexer of claim 8,
wherein two of the second IDT electrodes are formed with respect to the first IDT electrode;
two of the fourth IDT electrodes are formed with respect to the third IDT electrode;
the first IDT electrode is used as an input electrode, and the two of the second IDT electrodes are used as an output electrode; and
the third IDT electrode is used as an input electrode, and the two of the fourth IDT electrodes are used as an output electrode.

* * * * *